United States Patent
Suh

(10) Patent No.: US 10,451,696 B2
(45) Date of Patent: Oct. 22, 2019

(54) MAGNETIC RESONANCE IMAGING APPARATUS AND METHOD OF OBTAINING MAGNETIC RESONANCE IMAGE

(71) Applicant: SAMSUNG ELECTRONICS CO., LTD., Suwon-si (KR)

(72) Inventor: Hyun-sang Suh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 224 days.

(21) Appl. No.: 15/692,338

(22) Filed: Aug. 31, 2017

(65) Prior Publication Data
US 2018/0088197 A1 Mar. 29, 2018

(30) Foreign Application Priority Data

Sep. 26, 2016 (KR) .................. 10-2016-0123382

(51) Int. Cl.
G01R 33/56 (2006.01)
G01R 33/48 (2006.01)
(Continued)

(52) U.S. Cl.
CPC ..... *G01R 33/5602* (2013.01); *G01R 33/4818* (2013.01); *G01R 33/54* (2013.01);
(Continued)

(58) Field of Classification Search
CPC ................ G01R 33/54; G01R 33/4818; G01R 33/5602; G01R 33/5608; G01R 33/5615; G01R 33/5673
See application file for complete search history.

(56) References Cited

U.S. PATENT DOCUMENTS 6,801,800 B2 * 10/2004 Miyazaki ............. A61B 5/0263
324/306
6,804,546 B1 10/2004 Thompson et al.
(Continued)

FOREIGN PATENT DOCUMENTS

JP 5514279 B2 6/2014
JP 5719968 B2 5/2015
(Continued)

OTHER PUBLICATIONS

Communication dated Jun. 1, 2017, issued by the Korean intellectual Property Office in counterpart Korean Patent Application No. 10-2016-0123382.
(Continued)

*Primary Examiner* — Dixomara Vargas
(74) *Attorney, Agent, or Firm* — Sughrue Mion, PLLC

(57) ABSTRACT

An magnetic resonance imaging (MRI) apparatus and a method of obtaining a magnetic resonance (MR) image are provided. The MRI apparatus includes a processor that obtains k-space data including information on a high frequency region and a low frequency region, and corresponding to a first echo time within a single repetition time (TR), obtains second k-space data including information on at least a part of the low frequency region and corresponding to a second echo time within the single TR, and generating a plurality of reconstructed images having different contrasts based on the first k-space data and the second k-space data.

20 Claims, 10 Drawing Sheets

(51) Int. Cl.
*G01R 33/567* (2006.01)
*G01R 33/54* (2006.01)
*G01R 33/561* (2006.01)

(52) U.S. Cl.
CPC ..... *G01R 33/5608* (2013.01); *G01R 33/5615* (2013.01); *G01R 33/5673* (2013.01); *G01R 33/5617* (2013.01)

(56) References Cited

U.S. PATENT DOCUMENTS

| | | | |
|---|---|---|---|
| 7,479,782 B2 | 1/2009 | van den Brink | |
| 7,663,364 B2 | 2/2010 | Takai | |
| 7,777,486 B2 * | 8/2010 | Hargreaves | G01R 33/4828 324/309 |
| RE43,749 E * | 10/2012 | Miyazaki | A61B 5/7257 324/306 |
| 9,095,302 B2 | 8/2015 | Porter | |
| RE45,876 E * | 2/2016 | Miyazaki | A61B 5/7257 |
| 9,435,871 B2 * | 9/2016 | Hirai | A61B 5/055 |
| 9,529,066 B2 | 12/2016 | Frahm et al. | |
| 9,664,764 B2 | 5/2017 | Hwang et al. | |
| 2002/0032376 A1 * | 3/2002 | Miyazaki | A61B 5/0263 600/410 |
| 2006/0062731 A1 | 3/2006 | Bammer et al. | |
| 2009/0072826 A1 * | 3/2009 | Hargreaves | G01R 33/4828 324/309 |
| 2010/0322497 A1 | 12/2010 | Dempsey et al. | |
| 2013/0266203 A1 | 10/2013 | Geerts-Ossevoort et al. | |
| 2013/0293231 A1 * | 11/2013 | Hirai | A61B 5/055 324/309 |
| 2015/0042334 A1 | 2/2015 | Kannengiesser et al. | |
| 2016/0131729 A1 | 5/2016 | Kang et al. | |
| 2018/0092569 A1 * | 4/2018 | Li | G01R 33/022 |
| 2019/0094324 A1 * | 3/2019 | Seo | G01R 33/5607 |

FOREIGN PATENT DOCUMENTS

| | | |
|---|---|---|
| KR | 10-2013-0018584 A | 2/2013 |
| KR | 10-1283532 B1 | 7/2013 |
| KR | 10-2014-0097953 A | 8/2014 |
| KR | 10-2015-0018452 A | 2/2015 |
| KR | 10-2016-0056271 A | 5/2016 |

OTHER PUBLICATIONS

Communication issued by the European Patent Office dated Feb. 15, 2018 in counterpart European Patent Application No. 17189529.5.
Yi Tang et al., "Liver T2-weighted MR Imaging: Comparison of Fast and Conventional Half-Fourier Single-Shot Turbo Spin-Echo, Breath-Hold Turbo Spin-Echo, and Respiratory-triggered Turbo Spin-Echo Sequences", Radiology, Radiological Society of North America, Inc., Jun. 1997, pp. 766-772, vol. 203, No. 3, XP000853648.

* cited by examiner

120

130

|   | TR | NUMBER OF SLICES | # B.H | TOTAL TIME |
|---|---|---|---|---|
| TE1 | 1.6s | 48 | 5*(8s+8s) | 313s |
| TE2 | 1.6s | 48 | 5*(8s+8s) | |
| TE1 + TE2 | 2.0s | 48 | 6*(8s+8s) | 192s |

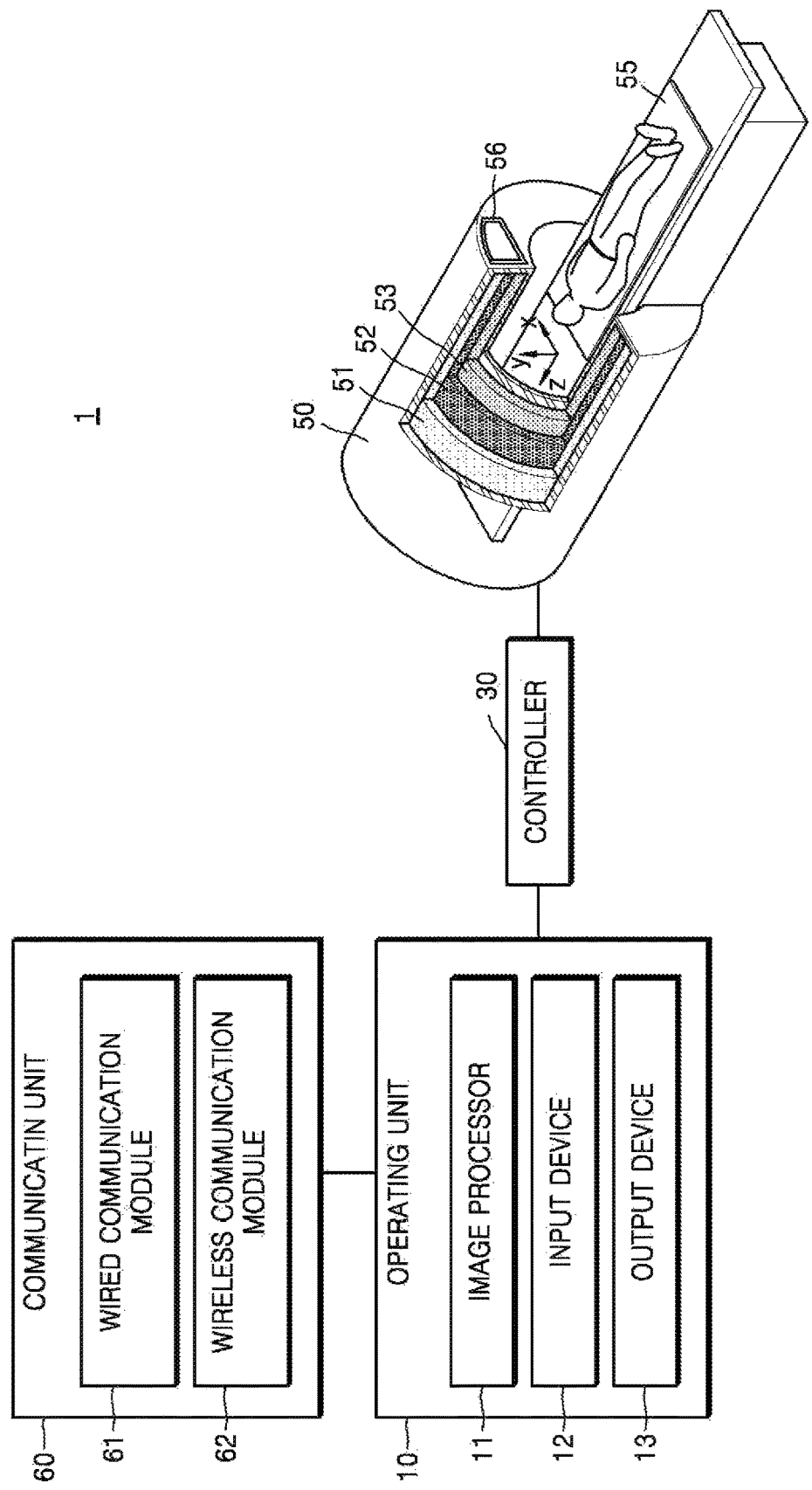

MAGNETIC RESONANCE IMAGING APPARATUS AND METHOD OF OBTAINING MAGNETIC RESONANCE IMAGE

CROSS-REFERENCE TO RELATED APPLICATION

This application claims priority from Korean Patent Application No. 10-2016-0123382, filed on Sep. 26, 2016, in the Korean Intellectual Property Office, the disclosure of which is incorporated herein in its entirety by reference.

BACKGROUND

1. Field

One or more exemplary embodiments of the present disclosure relates to magnetic resonance imaging (MRI) apparatuses and methods of obtaining magnetic resonance (MR) images, and more particularly, to MRI apparatuses for obtaining MR images having different contrasts and methods of obtaining MR images.

2. Description of the Related Art

A magnetic resonance imaging (MRI) apparatus uses a magnetic field for imaging a subject and is widely used to accurately diagnose a disease because the MRI apparatus can show not only soft tissue but also a slipped disc, joints, nerves, ligaments, etc. at desired angles in a three-dimensional (3D) manner.

In order to capture a magnetic resonance (MR) image, an MRI apparatus applies a radio frequency (RF) signal to an object and acquires an MR signal emitted from the object in response to the applied RF signal. To obtain a high quality MR image, the MRI apparatus may reconstruct a motion-corrected MR image from the acquired MR signal by correcting for artifacts caused by a movement of an object that has occurred during an MRI scan.

In related art, various methods of minimizing artifacts caused by movements of organs are used when the organs are imaged by using an MRI apparatus.

For example, an MR image may be obtained at a high speed in order to minimize artifacts caused by a movement of an organ. In order to obtain an MR image at a high speed, a single-shot fast spin echo (FSE) sequence may be used, and thus an MR image corresponding to one slice may be reconstructed based on data of k-space obtained within one repetition time (TR).

Images having different contrasts may be used to diagnose disease. For example, a disease may be diagnosed by comparing a T2-weighted image with a heavily T2-weighted image obtained by increasing T2 effect.

In the related art methods, in order to obtain a plurality of MR images having different contrasts, it is necessary to apply a plurality of pulse sequences corresponding to a plurality of contrasts. In this regard, when a region where a large movement occurs according to breathing such as the abdomen or the heart is to be imaged, the region has to be imaged by minimizing a movement of an organ while a patient holds their breath in an MRI apparatus. Accordingly, since imaging is performed only for a time during which the patient may hold their breath, it may take a long time to obtain images having different contrasts for a plurality of slices and patient inconvenience may be increased.

Also, since images having different contrasts are obtained are at different points in time, when images of the same slice having different contrasts are compared with each other, positions of a lesion included in the images of the same slice may be different according to a movement of an organ.

SUMMARY

One or more exemplary embodiments of the present disclosure may reduce a scan time by obtaining images having a plurality of contrasts by using one pulse sequence.

One or more exemplary embodiments of the present disclosure may minimize the influence of a movement of an organ by obtaining images having a plurality of contrasts during one breath-holding duration.

One or more exemplary embodiments of the present disclosure provide magnetic resonance imaging (MRI) apparatuses and methods for obtaining magnetic resonance (MR) images having different contrasts.

Additional aspects will be set forth in part in the description which follows and, in part, will be apparent from the description, or may be learned by practice of the presented embodiments.

According to an aspect of an exemplary embodiment, there is provided a magnetic resonance imaging (MRI) apparatus comprising: a memory configured to store a pulse sequence; and a processor configured to: apply the pulse sequence comprising a plurality of different echo times during one repetition time (TR), obtain first k-space data comprising information on a high frequency region and a low frequency region and corresponding to a first echo time, among the plurality of different echo times, based on the pulse sequence, obtain second k-space data comprising information on at least a part of the low frequency region and corresponding to a second echo time different from the first echo time, among the plurality of different echo times, based on the pulse sequence, and generate a plurality of reconstructed images having different contrasts based on the first k-space data and the second k-space data.

The plurality of reconstructed images having different contrasts may be magnetic resonance (MR) images obtained during a same breath-holding duration.

The first echo time may be a longest echo time among the plurality of different echo times.

The processor may be further configured to generate the plurality of reconstructed images having different contrasts by using the information on the high frequency region from among the first k-space data.

The processor may be further configured to: generate a first reconstructed image having a first contrast based on the first k-space data, and generate a second reconstructed image having a second contrast that is lower than the first contrast, based on the information on the high frequency region and the information on the at least the part of the low frequency region from among the first k-space data, and the second k-space data.

The first reconstructed image having the first contrast may be a heavily T2-weighted image and the second reconstructed image having the second contrast may be a T2-weighted image.

The processor may be further configured to: repeatedly apply the pulse sequence, and generate reconstructed images of a plurality of slices corresponding to a number of times the pulse sequence is repeatedly applied.

The first k-space data and the second k-space data obtained during the one TR may be pieces of k-space data of different slices.

The processor may be further configured to apply a signal for controlling a radio frequency (RF) coil and a gradient coil in a scanner in order to sequentially apply pulses for obtaining the first k-space data and pulses for obtaining the second k-space data.

The pulse sequence may comprise a single-shot fast spin echo (FSE).

According to an aspect of another exemplary embodiment, there is provide a method of obtaining a magnetic resonance (MR) image, the method comprising: applying a pulse sequence comprising a plurality of different echo times during one repetition time (TR); obtaining first k-space data comprising information on a high frequency region and a low frequency region, and corresponding to a first echo time, among the plurality of different echo times, based on the pulse sequence; obtaining second k-space data comprising information on at least a part of the low frequency region and corresponding to a second echo time different from the first echo time, among the plurality of different echo times, based on the pulse sequence; and generating a plurality of reconstructed images having different contrasts based on the first k-space data and the second k-space data.

The plurality of reconstructed images having different contrasts may be MR images obtained during a same breath-holding duration.

The first echo time may be a longest echo time among the plurality of different echo times.

The generating the plurality of reconstructed images having different contrasts may comprise generating the plurality of reconstructed images having different contrasts by using the information on the high frequency region from among the first k-space data.

The generating of the plurality of reconstructed images having different contrasts may comprise: generating a first reconstructed image having a first contrast based on the first k-space data; and generating a second reconstructed image having a second contrast that is lower than the first contrast, based on the information on the high frequency region and the information on the at least the part of the low frequency region from among the first k-space data, and the second k-space data.

The first reconstructed image having the first contrast may be a heavily T2-weighted image and the second reconstructed image having the second contrast may be a T2-weighted image.

The obtaining of the plurality of reconstructed images having different contrasts may comprise: repeatedly applying the pulse sequence; and generating reconstructed images of a plurality of slices corresponding to a number of times the pulse sequence is repeatedly applied.

The first k-space data and the second k-space data obtained during the one TR may be pieces of k-space data of different slices.

The applying of the pulse sequence may comprise applying a signal for controlling a radio frequency (RF) coil and a gradient coil in a scanner in order to sequentially apply pulses for obtaining the first k-space data and pulses for obtaining the second k-space data.

According to an aspect of another exemplary embodiment, there is provided a non-transitory computer-readable storage medium having embodied thereon a program for executing a method comprising: applying a pulse sequence comprising a plurality of different echo times during one repetition time (TR); obtaining first k-space data comprising information on a high frequency region and a low frequency region, and corresponding to a first echo time, among the plurality of different echo times, based on the pulse sequence; obtaining second k-space data comprising information on at least a part of the low frequency region and corresponding to a second echo time different from the first echo time, among the plurality of different echo times, based on the pulse sequence; and generating a plurality of reconstructed images having different contrasts based on the first k-space data and the second k-space data.

According to an aspect of another exemplary embodiment, there is provided a magnetic resonance imaging (MRI) apparatus comprising: a processor configured to: obtain first k-space data comprising information on a first frequency region and a second frequency region, and corresponding to a first time period within a single repetition time (TR); obtain second k-space data comprising information on at least a part of the second frequency region and corresponding to a second time period within the single TR, and generate a plurality of reconstructed images having different contrasts based on the first k-space data and the second k-space data.

A duration of the first time period may be longer than a duration of the second time period.

The processor may be further configured to generate the plurality of reconstructed images having different contrasts by using the information on the first frequency region from the first k-space data.

The processor may be further configured to: generate a first reconstructed image having a first contrast based on the first k-space data, and generate a second reconstructed image having a second contrast that is different than the first contrast, based on information on the first frequency region from the first k-space data, information on a first portion of the second frequency region from the first k-space data, and information on a second portion of the second frequency region, different from the first portion, from the second k-space data.

According to an aspect of another exemplary embodiment, there is provided a method of obtaining a magnetic resonance (MR) image, the method comprising: obtaining first k-space data comprising information on a first frequency region and a second frequency region, and corresponding to a first time period within a single repetition time (TR), obtaining second k-space data comprising information on at least a part of the second frequency region and corresponding to a second time period within the single TR, and generating a plurality of reconstructed images having different contrasts based on the first k-space data and the second k-space data.

A duration of the first time period may be longer than a duration of the second time period.

The generating the plurality of reconstructed images may comprise: generating the plurality of reconstructed images having different contrasts by using the information on the first frequency region from the first k-space data.

The generating the plurality of reconstructed images may comprise: generating a first reconstructed image having a first contrast based on the first k-space data, and generating a second reconstructed image having a second contrast that is different than the first contrast, based on information on the first frequency region from the first k-space data, information on a first portion of the second frequency region from the first k-space data, and information on a second portion of the second frequency region, different from the first portion, from the second k-space data.

BRIEF DESCRIPTION OF THE DRAWINGS

These and/or other aspects will become apparent and more readily appreciated from the following description of the exemplary embodiments, taken in conjunction with the accompanying drawings in which:

FIG. 9 is a diagram of a general MRI system according to an exemplary embodiment.

DETAILED DESCRIPTION

Figure 1A:
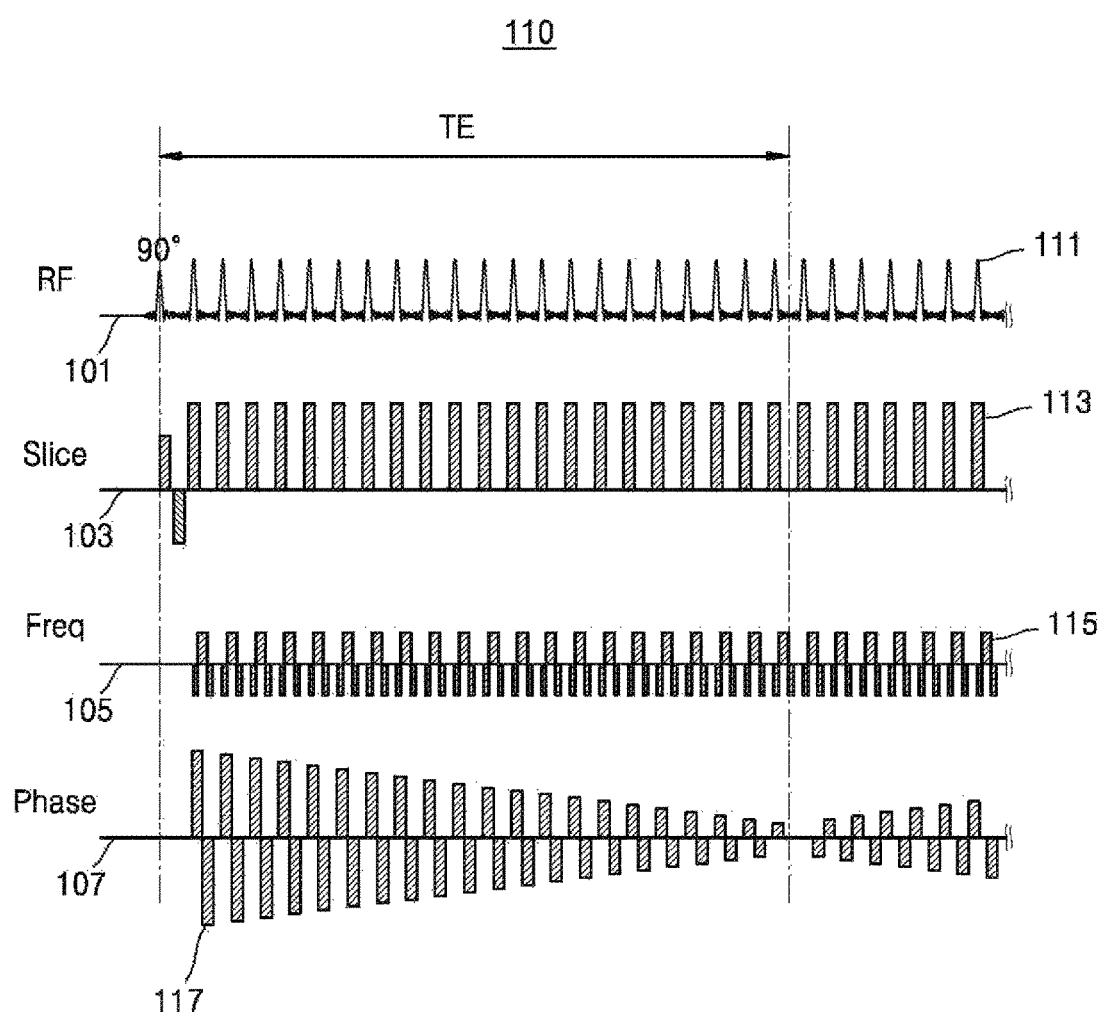
FIG. 1A is a diagram for explaining a process of obtaining a magnetic resonance (MR) signal by using a fast spin echo (FSE) pulse sequence according to an exemplary embodiment.

Hereinafter, exemplary embodiments will be described in detail with reference to accompanying drawings. Elements illustrated in the accompanying drawings are referred to in the following descriptions of the exemplary embodiments and for clarity, like reference numerals or symbols presented in respective drawings denote like elements, which substantially perform the same functions.

In the following description, if terminologies, each of which includes such an ordinal number as 'first', 'second' and the like, are used, those terminologies are used (unless expressly specified otherwise) merely to describe various elements. The terminologies are only used for the purpose of differentiating one element from other elements. In doing so, the various elements should be non-limited by the corresponding terminologies, respectively. The terminologies used in the following description of various exemplary embodiments are applied for explanation purpose only and not for the purpose of limiting the exemplary embodiments as defined by the appended claims and their equivalents.

Like reference numerals refer to like elements throughout the disclosure. The term "part" or "portion" may be implemented using hardware or software, and according to exemplary embodiments, one "part" or "portion" may be formed as a single unit or element or include a plurality of units or elements. Hereinafter, the principles and exemplary embodiments of the present disclosure will be described in detail with reference to the accompanying drawings.

In the present disclosure, an "image" may include, but is not limited to, a medical image obtained by a magnetic resonance imaging (MRI) apparatus, a computed tomography (CT) apparatus, an ultrasound imaging apparatus, an X-ray apparatus, or another medical imaging apparatus.

Furthermore, in the present disclosure, an "object" may be, but is not limited to, a target to be imaged and include, but is not limited to, a human, an animal, or a part of a human or animal. For example, the object may include a body part (an organ) or a phantom.

An MRI system acquires an MR signal and reconstructs the acquired MR signal into an image. The MR signal denotes an RF signal emitted from the object.

In the MRI system, a main magnet creates a static magnetic field to align a magnetic dipole moment of a specific atomic nucleus of the object placed in the static magnetic field along a direction of the static magnetic field. A gradient coil may generate a gradient magnetic field by applying a gradient signal to a static magnetic field and induce resonance frequencies differently according to each region of the object.

An RF coil may emit an RF signal to match a resonance frequency of a region of the object whose image is to be acquired. Furthermore, when gradient magnetic fields are applied, the RF coil may receive MR signals having different resonance frequencies emitted from a plurality of regions of the object. Through this process, the MRI system may obtain an image from an MR signal by using an image reconstruction technique.

As used herein, the term "and/or" includes any and all combinations of one or more of the associated listed items. Expressions such as "at least one of", when preceding a list of elements, modify the entire list of elements and do not modify the individual elements of the list.

FIG. 1A is a diagram for explaining a process of obtaining an MR signal by using a fast spin echo (FSE) pulse sequence according to an exemplary embodiment.

An FSE pulse sequence diagram 110 of FIG. 1A may illustrate, for example, an echo-planar FSE pulse sequence.

An RF pulse RF 101, a slice selection gradient magnetic field 103, a frequency encoding gradient magnetic field 105, and a phase encoding gradient magnetic field 107 may be controlled, according to the FSE pulse sequence diagram 110.

According to an exemplary embodiment, the frequency encoding gradient magnetic field 105, the phase encoding gradient magnetic field 107, and the slice selection gradient magnetic field 103 may respectively correspond to X, Y, and Z-axis gradient magnetic fields.

According to the FSE pulse sequence diagram 110 of FIG. 1A, one two-dimensional (2D) k-space data may be obtained during one repetition time (TR). The one TR for obtaining the k-space data may include one RF excitation pulse or a small number of RF excitation pulses.

According to the FSE pulse sequence diagram 110 of an exemplary embodiment, an RF excitation pulse of 90° may be first applied and then an RF pulse 111 of 180° may be applied at a predetermined interval. The predetermined interval may correspond to an interecho spacing. The interecho spacing refers to an interval between echoes that are generated between a pulse of 180° and a pulse of 180° in the FSE pulse sequence.

Also, the slice selection gradient magnetic field 103 including a pulse 113 for slice selection, the encoding gradient magnetic field 105 including a pulse 115 for frequency encoding, and the phase encoding gradient 107 including a pulse 117 for phase encoding may be applied in response to multiple applications of the RF pulse 111 of 180°.

In the FSE pulse sequence diagram 110 of FIG. 1A, an echo time TE may be a time between a point at which the RF excitation pulse of 90° is applied and a point at which the phase encoding gradient magnetic field 107 has a lowest level.

Figure 1B:
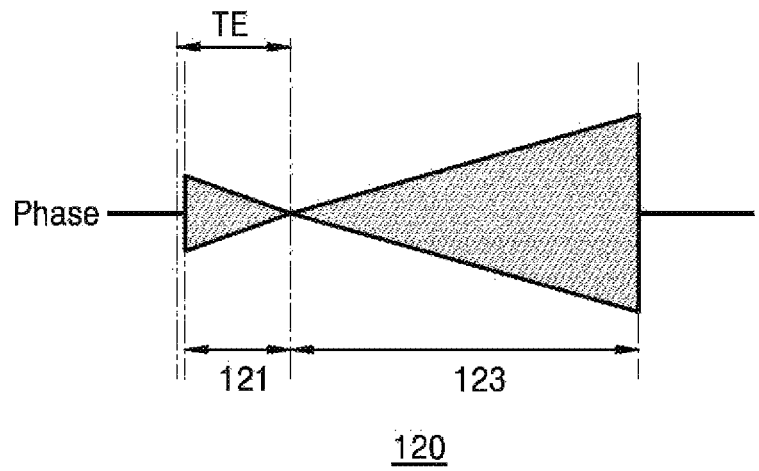
FIG. 1B is a diagram for explaining an echo time and a phase encoding gradient magnetic field controlled by an FSE pulse sequence according to an exemplary embodiment.
Figure 1B:
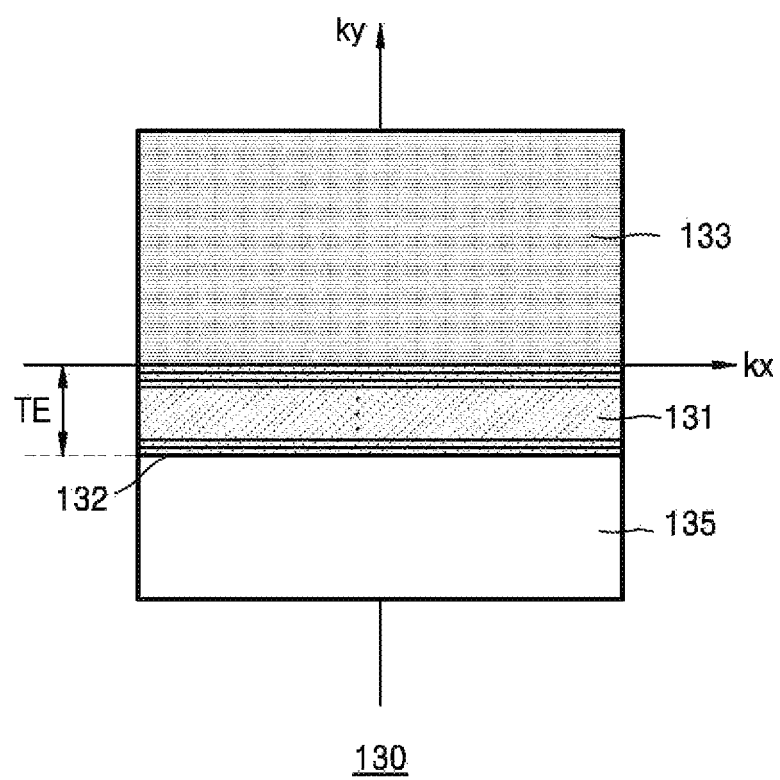

FIG. 1B is a diagram for explaining an echo time TE and a phase encoding gradient magnetic field controlled by an FSE pulse sequence according to an exemplary embodiment.

A phase encoding gradient magnetic field diagram 120 of FIG. 1B illustrates a level of a phase encoding gradient magnetic field according to a time in an FSE pulse sequence.

The phase encoding gradient magnetic field diagram 120 of FIG. 1B may include a portion omitted in a graph of the phase encoding gradient magnetic field 107 of the FSE pulse sequence diagram 110 of FIG. 1A.

Also, a k-space 130 of FIG. 1B is a k-space obtained by the FSE pulse sequence. Data of the k-space 130 may be obtained according to each data line 132 corresponding to a level of a phase encoding gradient magnetic field.

For example, k-space data included in a first region 131 of the k-space 130 may be obtained during a first duration 121 in the phase encoding gradient magnetic field diagram 120. Also, k-space data included in a second region 133 of the k-space 130 may be obtained during a second duration 123 in the phase encoding gradient magnetic field diagram 120.

Data about a third region 135 where k-space data is not obtained from among data of the k-space 130 may be reconstructed based on data about at least one of the first region 131 and the second region 133.

Referring to the phase encoding gradient magnetic field diagram 120, an echo time TE may be a time between a point at which an RF excitation pulse of 90° is applied and a point at which a level of a gradient magnetic field in the phase encoding gradient magnetic field diagram 120 is 0. Also, the echo time TE may correspond to a length of the first region 131 along the ky-axis in the k-space 130.

The number of the k-space data lines 132 obtained in the first region 131 of the k-space 130 may be determined by the echo time TE.

For example, the number of the k-space data lines 132 obtained in the first region 131 when the echo time TE is long may be greater than that when the echo time TE is short.

Also, the number of the k-space data lines 132 obtained in the first region 131 may be determined based on an interecho spacing and the echo time TE. The interecho spacing refers to an interval between echoes that are generated between a pulse of 180° and a pulse of 180° in the FSE pulse sequence. For example, the number of the k-space data lines 132 obtained in the first region 131 may be determined by using an "echo time TE/interecho spacing".

According to an exemplary embodiment, contrast of an MR image obtained by the FSE pulse sequence of FIG. 1B may be determined based on the echo time TE.

For example, a heavily T2-weighted image may be obtained by using an FSE pulse sequence having a first echo time, and a T2-weighted image may be obtained by using an FSE pulse sequence having a second echo time that is shorter than the first echo time.

Figure 2:
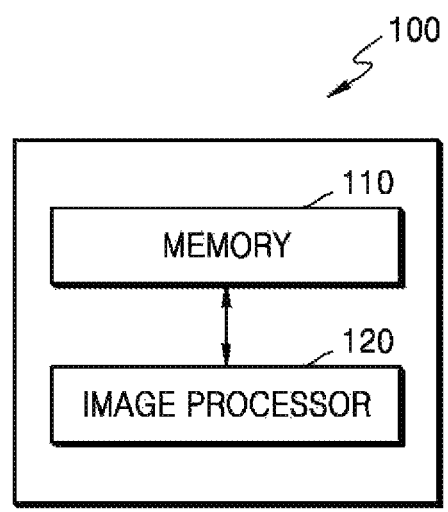
FIG. 2 is a block diagram of a magnetic resonance imaging (MRI) apparatus according to an exemplary embodiment.

FIG. 2 is a block diagram of an MRI apparatus 100 according to an exemplary embodiment.

According to an exemplary embodiment, the MRI apparatus 100 may obtain a plurality of MR images having different contrasts.

Also, the MRI apparatus 100 of FIG. 2 may obtain an MR image by imaging an object during an MRI scan. Also, the MRI apparatus 100 may obtain an MR image by processing MR data obtained by imaging the object during an MRI scan.

For example, the MRI apparatus 100 may be an apparatus that applies an RF pulse to the object through a plurality of channel coils included in a high frequency multi-coil (not shown) and reconstructs an MR image by using an MR signal obtained through the plurality of channel coils.

Also, the MRI apparatus 100 may be a server that provides a pulse sequence to be applied to the object and reconstructs an MR image by using an MR signal obtained according to the pulse sequence. The server may be a medical server in a hospital in which a patient is imaged during an MRI scan or another hospital.

Referring to FIG. 2, according to an exemplary embodiment the MRI apparatus 100 may include a memory 110 and an image processor 120.

The memory 110 may store a pulse sequence to be applied to the object. Also, the memory 110 may store an MR signal obtained based on the pulse sequence.

The image processor 120 may apply a pulse sequence. For example, the image processor 120 may apply a signal for controlling a waveform generator (not shown) that generates a gradient waveform, that is, a current pulse, according to the pulse sequence and a gradient amplifier (not shown) that amplifies the generated current pulse and transmits the amplified current pulse to a scanner (not shown).

Also, the image processor 120 may obtain an MR signal based on the pulse sequence stored in the memory 110 or a pulse sequence received from an external device (not shown).

The image processor 120 according to an exemplary embodiment may obtain an MR signal of the object that is generated based on the pulse sequence. The image processor 120 may store the MR signal as k-space data in the memory 110.

For example, the MR signal may be a signal received from the scanner (not shown). Also, the MR signal may be received from the memory 110 of the MRI apparatus 100 or the external device (not shown).

Examples of the pulse sequence may include a gradient echo sequence, a spin echo sequence, an FSE sequence, a single-shot FSE sequence, and a gradient-and-spin echo (GRASE) sequence.

The image processor 120 may obtain an image of the object based on the obtained MR signal of the object. The image processor 120 may include a module for reconstructing an MR image.

The image processor 120 according to an exemplary embodiment may apply a pulse sequence including a plurality of different echo times during one TR.

The image processor 120 may obtain first k-space data including pieces of data about a high frequency region and a low frequency region and corresponding to a first echo time that is one from among the plurality of different echo times, based on the pulse sequence. Hereinafter, the first k-space data refers to data corresponding to the first echo time.

The image processor 120 may obtain second k-space data including data about at least a part of the low frequency region and corresponding to a second echo time that is different from the first echo time from among the plurality of different echo times, based on the pulse sequence.

The image processor 120 may obtain a plurality of reconstructed images having different contrasts based on the first k-space data and the second k-space data. The plurality of reconstructed images having different contrasts may be MR images obtained during the same breath-holding duration.

According to an exemplary embodiment, the first echo time may be a longest echo time from among the plurality of different echo times.

The image processor 120 may obtain the plurality of reconstructed images having different contrasts by using the data about the high frequency region from among the first k-space data. That is, the plurality of reconstructed images may be reconstructed based on the data about the same high frequency region.

The image processor 120 may reconstruct an image having a first contrast based on the first k-space data. Also, the image processor 120 may reconstruct an image having a second contrast that is lower than the first contrast, based on the data about the high frequency region and data about at least a part of the low frequency region from among the first k-space data, and the second k-space data.

According to an exemplary embodiment, the image having the first contrast may be a heavily T2-weighted image and the image having the second contrast may be a T2-weighted image.

The image processor 120 may repeatedly apply a pulse sequence and may obtain reconstructed images of a plurality of slices corresponding to the number of times the pulse sequence is repeatedly applied.

For example, the image processor 120 may reconstruct MR images having different contrasts for two slices by using the first k-space data and the second k-space data obtained during at least two TRs.

The first k-space data and the second k-space data obtained during one TR may be pieces of k-space data about different slices.

The image processor 120 may apply a control signal for sequentially applying pulses for obtaining the first k-space data and pulses for obtaining the second k-space data. For example, the image processor 120 may apply a signal for controlling an RF coil (not shown) and a gradient coil (not shown) in the scanner (not shown) to sequentially apply pulses for obtaining the first k-space data and pulses for obtaining the second k-space data.

Figure 3:
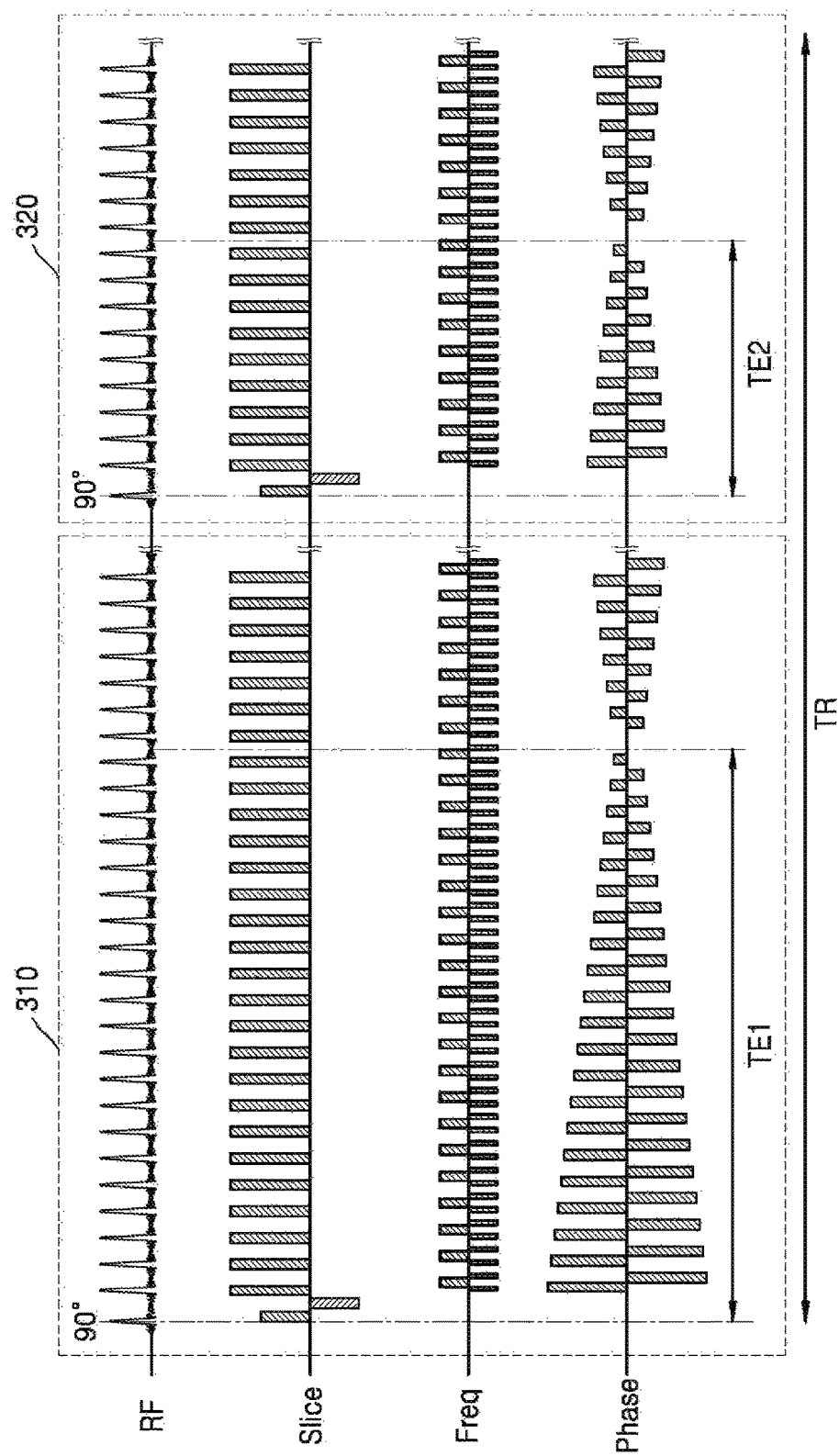
FIG. 3 is a diagram illustrating a pulse sequence applied by the MRI apparatus according to an exemplary embodiment.

FIG. 3 is a pulse sequence diagram 300 illustrating a pulse sequence applied by the MRI apparatus 100 according to an exemplary embodiment.

The pulse sequence diagram 300 of FIG. 3 may illustrate a pulse sequence including a plurality of different echo times during one TR applied by the MRI apparatus 100.

For example, the pulse sequence diagram 300 may show an FSE pulse sequence including a plurality of different echo times. The FSE pulse sequence is the same as that of FIG. 1A and thus a detailed explanation thereof will not be given.

Referring to FIG. 3, the pulse sequence diagram 300 may include a first pulse sequence portion 310 including a first echo time TE1 and a second pulse sequence portion 320 including a second echo time TE2. The first echo time TE1 may be a longest echo time from among the plurality of different echo times.

Although the pulse sequence diagram 300 includes only the first pulse sequence portion 310 and the second pulse sequence portion 320 in FIG. 3, the pulse sequence diagram 300 may further include additional pulse sequence portions corresponding to a third echo time TE3 and a fourth echo time TE4 according to other exemplary embodiments.

The MRI apparatus 100 may apply a control signal for applying pulses for obtaining first k-space data by using the first pulse sequence portion 310. The first k-space data may include a high frequency region and a low frequency region.

The MRI apparatus 100 may apply a control signal for applying pulses for obtaining second k-space data by using the second pulse sequence portion 320. The second k-space data may include data about the low frequency region.

Figure 4:
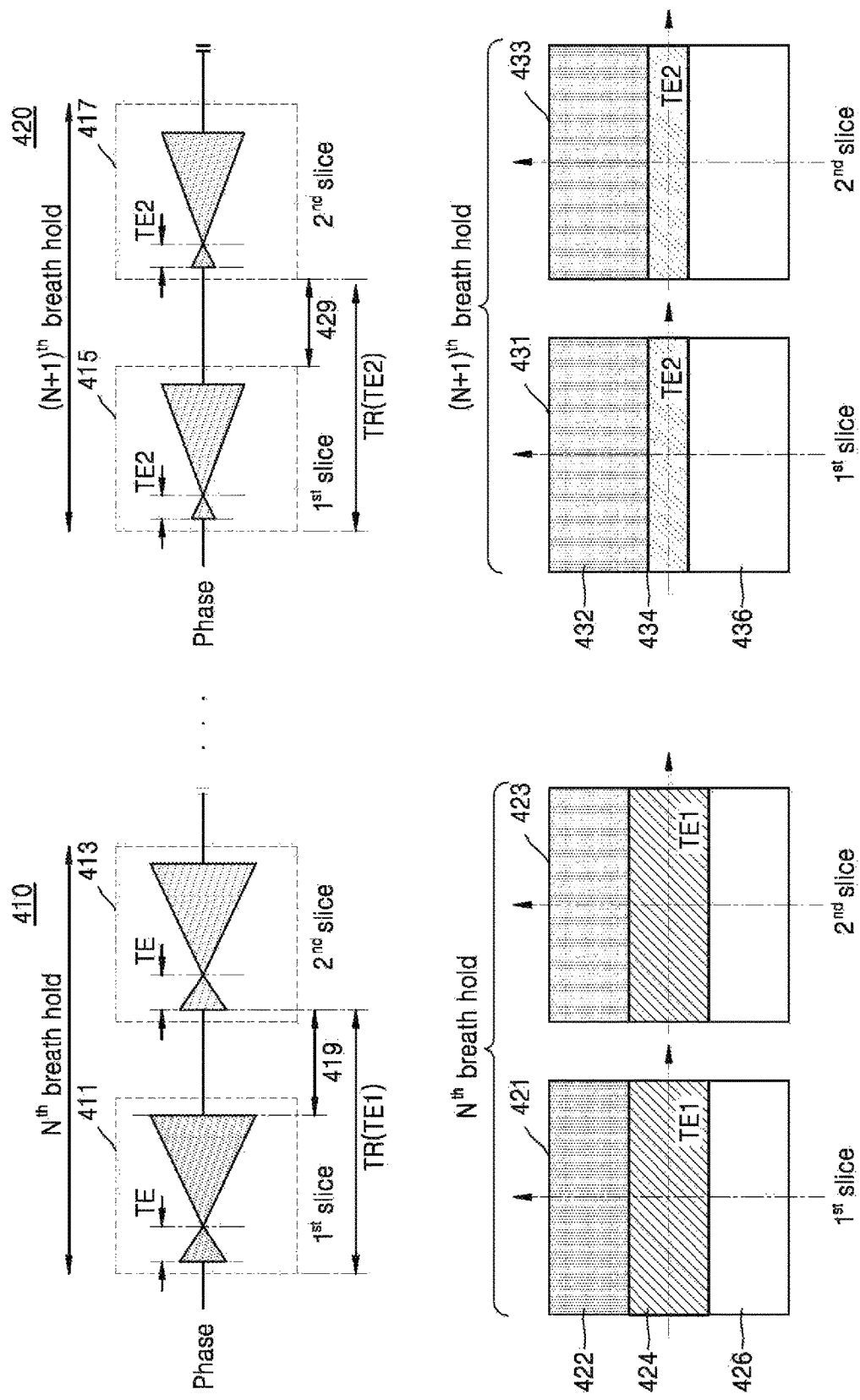
FIG. 4 is a diagram for explaining a method performed by the MRI apparatus to obtain an image having a first contrast and an image having a second contrast according to an exemplary embodiment.

FIG. 4 is a diagram for explaining a method performed by the MRI apparatus 100 to obtain an image having a first contrast and an image having a second contrast according to an exemplary embodiment.

In detail, FIG. 4 illustrates a case where k-space data about a plurality of slices having a first contrast is obtained and then k-space data about a plurality of slices having a second contrast is obtained.

A phase encoding gradient magnetic field diagram 410 may show a phase encoding gradient magnetic field included in a pulse sequence having a first echo time TE1. The first echo time TE1 may correspond to the first contrast. For example, the phase encoding gradient magnetic field diagram 410 may show a phase encoding gradient magnetic field applied during an $N^{th}$ breath-holding duration.

The phase encoding gradient magnetic field diagram 410 may include a first phase encoding portion 411 corresponding to a first slice and a second phase encoding portion 413 corresponding to a second slice. The first phase encoding portion 411 and the second phase encoding portion 413 may include a portion omitted in a phase encoding gradient magnetic field graph of the first pulse sequence portion 310 of FIG. 3.

Pieces of first k-space data 421 and 423 of FIG. 4 may be k-space data corresponding to the phase encoding gradient magnetic field diagram 410.

In detail, the first k-space data 421 may correspond to the first phase encoding portion 411. According to an exemplary embodiment, the first k-space data 421 may include data about a high frequency region 422, data about a low frequency region 424, and data about a region 426 where data is not obtained. The data about the region 426 where data is not obtained may be reconstructed based on the data about at least one of the high frequency region 422 and the low frequency region 424.

Also, the first k-space data 423 may correspond to the second phase encoding portion 413. Likewise, the first k-space data 423 may include data about the high frequency region 422, data about the low frequency region 424, and data about the region 426 where data is not obtained.

A phase encoding gradient magnetic field diagram 420 may show a phase encoding gradient magnetic field included in a pulse sequence having a second echo time TE2. The second echo time TE2 may correspond to the second contrast. For example, the phase encoding gradient magnetic field diagram 420 may show a phase encoding gradient magnetic field applied during an $(N+1)^{th}$ breath-holding duration.

The phase encoding gradient magnetic field diagram 420 includes a third phase encoding portion 415 corresponding to the first slice and a fourth phase encoding portion 417 corresponding to the second slice. Also, the phase encoding gradient magnetic field diagram 420 of FIG. 4 may include a portion omitted in a phase encoding gradient magnetic field graph of the second pulse sequence portion 320 of FIG. 3.

Pieces of second k-space data 431 and 433 of FIG. 4 may be k-space data corresponding to the phase encoding gradient magnetic field diagram 420.

In detail, the second k-space data 431 may correspond to the third phase encoding portion 415. The second k-space data 431 may include data about a high frequency region 432, a low frequency region 434, and a region 436 where data is not obtained. The data about the region 436 where data is not obtained may be reconstructed based on the data about at least one of the high frequency region 432 and the low frequency region 434.

When the second echo time TE2 is shorter than the first echo time TE1, the low frequency region 434 of the second k-space data 431 may be narrower than the low frequency region 424 of the first k-space data 421.

Also, the second k-space data 433 may correspond to the fourth phase encoding portion 417. Likewise, the second k-space data 433 may include data about the high frequency region 432, the low frequency region 434, and the region 436 where data is not obtained.

According to an exemplary embodiment illustrated in FIG. 4, an MR image of a plurality of slices having the first contrast may be obtained based on a pulse sequence corresponding to the phase encoding gradient magnetic field diagram 410.

Each of the first phase encoding portion 411 and the second phase encoding portion 413 in the phase encoding gradient magnetic field diagram 410 may correspond to one TR. A relaxation duration 419 for preventing specific absorption rate (SAR) limits from being exceeded is needed between the first phase encoding portion 411 corresponding to the first slice and the second phase encoding portion 413 corresponding to the second slice. Accordingly, a TR for obtaining an MR image of one slice having the first contrast may be determined as a time including a time taken for the first phase encoding portion 411 and the relaxation duration 419.

For example, when the time taken for the first phase encoding portion 411 is about 1000 ms and the relaxation duration 419 is about 600 ms, a TR for the first phase encoding portion 411 may be about 1.6 s. The first phase encoding portion 411 for obtaining an image having the first contrast corresponds to the first echo time TE1 and a TR for obtaining an image having the first contrast is denoted by TR(TE1).

Accordingly, according to an exemplary embodiment, when it is assumed that a breathing guide time is about 8 seconds and it takes the next 8 seconds for an examinee to control breathing, about 10*(8 seconds+8 seconds), that is, 160 seconds, may be taken to obtain an image having the first contrast for 48 slices.

Also, an MR image of a plurality of slices having the second contrast may be obtained based on a pulse sequence corresponding to the phase encoding gradient magnetic field diagram 420.

Similar to the phase encoding gradient magnetic field diagram 410, each of the third phase encoding portion 415 and the fourth phase encoding portion 417 in the phase encoding gradient magnetic field diagram 420 may correspond to one TR. Also, a relaxation duration 429 may be needed between the third phase encoding portion 415 and the fourth phase encoding portion 417.

A TR for obtaining an image having the second contrast may also be about 1.6 s. The third phase encoding portion 415 for obtaining an image having the second contrast corresponds to the second echo time TE2 and a TR for obtaining an image having the second contrast is denoted by TR(TE2) in FIG. 4.

Accordingly, 160 seconds may be taken to obtain an image having the second contrast for 48 slices.

According to an exemplary embodiment illustrated in FIG. 4, there may be a difference between a point in time when an image having the first contrast is obtained and a point in time when an image having the second contrast is obtained. For example, an image having the first contrast for the first slice may be obtained during the $N^{th}$ breath-holding duration and an image having the second contrast may be obtained during the $(N+1)^{th}$ breath-holding duration.

According to a breath-holding duration, an amount of movement of the abdomen may be different than an amount of breathing of an object. Accordingly, for the same slice, a position of a lesion and a position of the object included in an image having the first contrast may be different from a position of the lesion and a position of the object included in an image having the second contrast.

Figure 5:
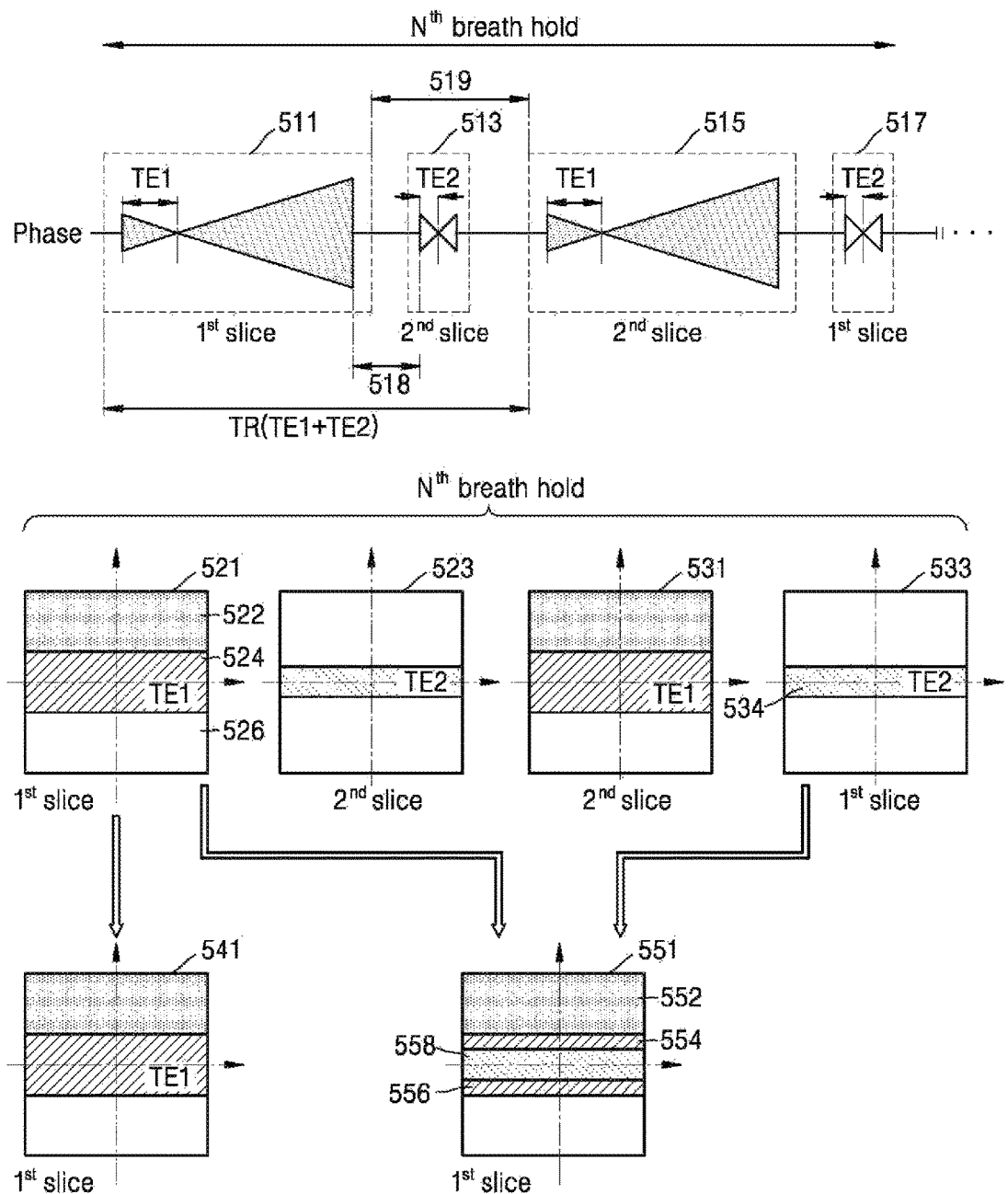
FIG. 5 is a diagram for explaining a method performed by the MRI apparatus to obtain an image having a first contrast and an image having a second contrast during one breath-holding duration according to an exemplary embodiment.

FIG. 5 is a diagram for explaining a method performed by the MRI apparatus 100 to obtain an image having a first contrast and an image having a second contrast during one breath-holding duration according to an exemplary embodiment.

In detail, in FIG. 5, first k-space data about a plurality of slices having a first contrast is obtained and at the same time, second k-space data used to reconstruct k-space data about a plurality of slices having a second contrast is obtained.

A phase encoding gradient magnetic field diagram may include a first phase encoding portion 511 corresponding to a first slice and a second phase encoding portion 515 corresponding to a second slice. The first phase encoding portion 511 and the second phase encoding portion 515 of FIG. 5 may respectively correspond to the first phase encoding portion 411 and the second phase encoding portion 413 of FIG. 4.

A first low frequency phase encoding portion 513 corresponding to the second slice may be located between the first phase encoding portion 511 and the second phase encoding portion 515 of the phase encoding gradient magnetic field diagram 510. Also, a second low frequency phase encoding portion 517 corresponding to the first slice may be located after the second phase encoding portion 515. The first low frequency phase encoding portion 513 and the second low frequency phase encoding portion 517 may correspond to data about a low frequency region from among the k-space data.

First k-space data 521 of FIG. 5 may be k-space data corresponding to the first phase encoding portion 511 and first k-space data 531 may be k-space data corresponding to the second phase encoding portion 515. The first k-space data 521 and 531 may each include data about a high frequency region 522, a low frequency region 524, and a region 526 where data is not obtained.

Also, second k-space data 523 of FIG. 5 may be k-space data corresponding to the second low frequency phase encoding portion 513 and second k-space data 533 may be k-space data corresponding to the second low frequency phase encoding portion 517. The second k-space data 523 and 533 may each include data about a low frequency region 534.

The low frequency region 534 of the second k-space data 523 and 533 may include at least a part of the low frequency region 524 of the first k-space data 521 and 531.

According to an exemplary embodiment, the MRI apparatus 100 may reconstruct an image having the first contrast based on first k-space data 541. When an image having the first contrast for the first slice is to be reconstructed, the first k-space data 541 may be the same as the first k-space data 521.

The MRI apparatus 100 may reconstruct an image having the second contrast based on combined k-space data 551.

For example, the combined k-space data 551 for reconstructing an image having the second contrast for the first slice may be data combined based on the first k-space data 521 and the second k-space data 533.

In detail, when an image having the second contrast for the first slice is to be reconstructed, the combined k-space data 551 may include data about the high frequency region 552 that is the same as the data about the high frequency region 522 of the first k-space data 521.

Also, in this case, the combined k-space data 551 may include data about a first low frequency region 558 that is the same as the data about the low frequency region 534 of the second k-space data 533.

Also, the combined k-space data 551 may include data about second low frequency regions 554 and 556 that are the same as data about at least a part of the low frequency region 524 of the first k-space data 521.

Data about a low frequency region in a k-space may mostly affect contrast of an MR image. Accordingly, the MRI apparatus 100 may obtain an image having the second contrast corresponding to a second echo time by replacing and combining only data corresponding to the low frequency region 534 of the second k-space data 533 from among the first k-space data 521.

Also, the MRI apparatus 100 may reduce ringing artifacts caused by a boundary between regions corresponding to different echo times in the k-space by using a smoothing filter.

According to an exemplary embodiment illustrated in FIG. 5, the first phase encoding portion 511, the first low frequency phase encoding portion 513, the second phase encoding portion 515, and the second low frequency phase encoding portion 517 may all be included in an $N^{th}$ breath-holding duration.

According to an exemplary embodiment illustrated in FIG. 5, images of the first slice having different contrasts may be obtained based on the first phase encoding portion 511 and the second low frequency phase encoding portion 517. Since the images of the first slice having different contrasts are included in the $N^{th}$ breath-holding duration, the influence of a movement due to breathing may be minimized.

Also, referring to FIG. 5, the first low frequency phase encoding portion 513 may be located in a duration 519 between the first phase encoding portion 511 and the second phase encoding portion 515.

Accordingly, the duration 519 between the first phase encoding portion 511 and the second phase encoding portion 515 may be longer than the relaxation duration 419 (see FIG. 4) for preventing SAR limits from being exceeded.

An amount of the k-space data 513 obtained by the first low frequency phase encoding portion 513 is relatively small. Accordingly, a relaxation duration 518, for preventing SAR limits from being exceeded, between the first phase encoding portion 511 and the first low frequency phase encoding portion 513 may be shorter than the relaxation duration 419 (see FIG. 4).

Also, since an amount of the k-space data 523 obtained by the first low frequency phase encoding portion 513 is smaller than that of the k-space data 431 of FIG. 4, a scan time may be shorter than that in FIG. 4.

Accordingly, as the first low frequency phase encoding portion 513 is located in the duration 519 between the first phase encoding portion 511 and the second phase encoding portion 515, a total time including a relaxation time and a scan time for obtaining images having different contrasts for a plurality of slices may be reduced.

Also, the first k-space data 521 and the second k-space data 523 obtained during one TR may be pieces of k-space data about different slices. Accordingly, the influence of interference occurring when images corresponding to different echo times for one slice are obtained may be reduced.

Figures 6A, 6B:
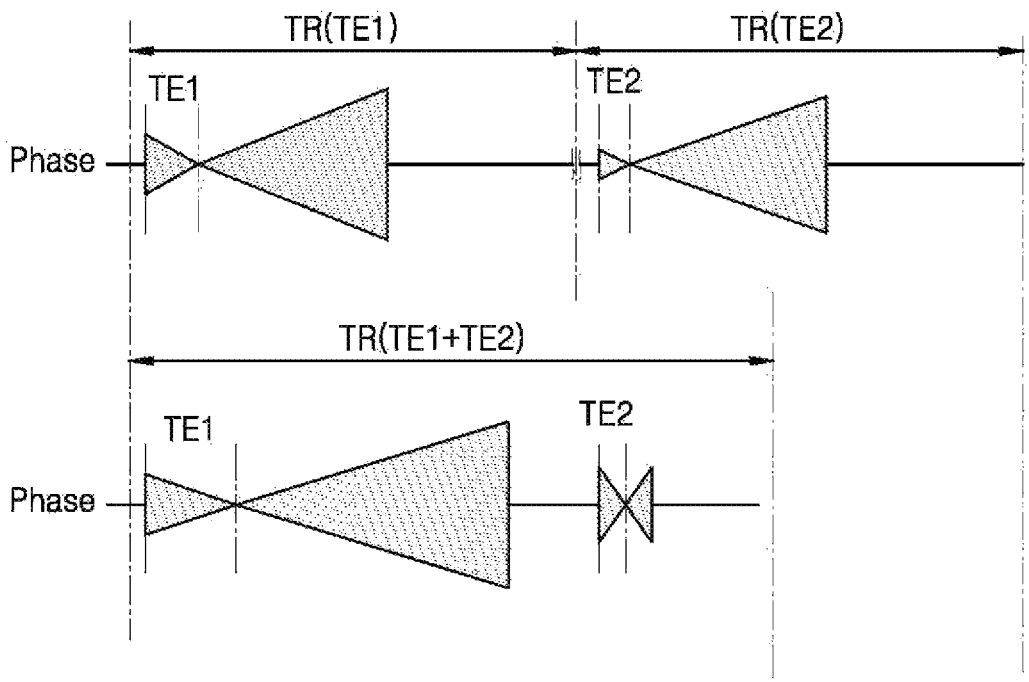
FIG. 6A is a diagram for explaining a scan time when the MRI apparatus obtains images having different contrasts according to an exemplary embodiment.
FIG. 6B is a diagram for explaining a scan time when the MRI apparatus obtains images having different contrasts according to an exemplary embodiment.

FIG. 6A is a diagram for explaining a scan time when the MRI apparatus 100 obtains images having different contrasts according to an exemplary embodiment.

Referring to FIG. 6A, TR(TE1) may denote a TR when data is obtained by an additional sequence having a first echo time for obtaining an image having a first contrast. For example, TR(TE1) may correspond to TR(TE1) of FIG. 4.

Also, TR(TE2) may denote a TR when data is obtained by an additional sequence having a second echo time for obtaining an image having a second contrast. For example, TR(TE2) may correspond to TR(TE2) of FIG. 4.

Also, TR(TE1+TE2) may denote a TR when k-space data about one slice having the first contrast and k-space data about the slice having the second contrast are obtained by a pulse sequence including the first echo time and the second echo time. For example, TR(TE1+TE2) may correspond to TR(TE1+TE2) of FIG. 5.

Referring to FIG. 6A, TR(TE1+TE2), according to an exemplary embodiment, may be less than a sum of TR(TE1) and TR(TE2).

FIG. 6B illustrates a scan time when the MRI apparatus 100 obtains images having different contrasts according to an exemplary embodiment.

Referring to a table of FIG. 6B, total times required according to exemplary embodiments when k-space data about a plurality of slices having a first contrast and k-space data about a plurality of slices having a second contrast are to be obtained may be compared.

A TR when an image having the first contrast is to be obtained by an additional sequence having a first echo time in a case of TE1 may be about 1.6 seconds. Also, a TR when an image having the second contrast is to be obtained by an additional sequence having a second echo time in a case of TE2 may be about 1.6 seconds.

Also, a TR when k-space data about one slice having the first contrast and k-space data about the slice having the second contrast are to be obtained during the same breath-holding duration by a pulse sequence including the first echo time and the second echo time in a case of TE1 may be about 2.0 seconds.

Referring to FIG. 6B, when images of 48 slices in total are to be obtained, the number (#B.H) of breath-holding durations may be 5 in the case of TE1, 5 in the case of TE2, and 6 in the case of TE1+TE2.

Referring to FIG. 6B, when total times are compared, the total times in the case of TE1 and in the case of TE2 may be 313 seconds, and the total time in the case of TE1 may be 192 seconds.

Figure 7:
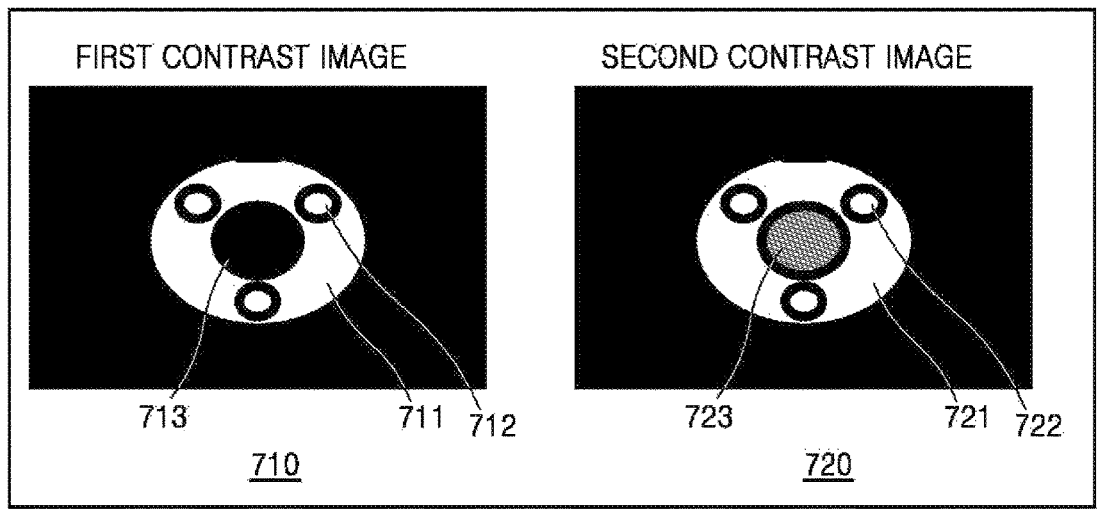
FIG. 7 illustrates images having different contrasts obtained by the MRI apparatus according to an exemplary embodiment.
Figure 7:
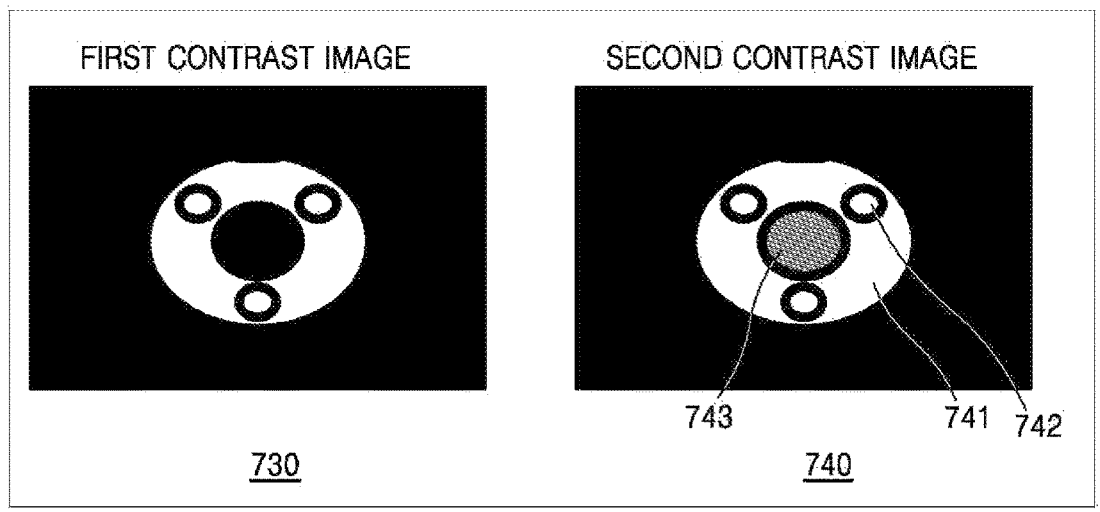

FIG. 7 illustrates images having different contrasts obtained by the MRI apparatus 100 according to an exemplary embodiment.

In FIG. 7, when an MR image of a plurality of slices having a first contrast and an MR image of a plurality of slices having a second contrast are to be obtained, images obtained according to exemplary embodiments are compared.

A first contrast image 710 is an image obtained by an additional sequence having a first echo time for obtaining an image having a first contrast. A second contrast image 720 is an image obtained by an additional sequence having a second echo time for obtaining an image having a second contrast. The first contrast may correspond to a heavily T2-weighted image. The second contrast may correspond to a T2-weighted image.

Also, a first contrast image 730 and a second contrast image 740 are images obtained by a pulse sequence including the first echo time and the second echo time according to an exemplary embodiment.

In detail, the first contrast image 730 may be an image reconstructed based on first k-space data including data about a high frequency region and a low frequency region and corresponding to the first echo time.

The second contrast image 740 may be an image reconstructed based on data about the high frequency region and data about a least a part of the low frequency region from among the first k-space data, and the second k space data corresponding to the second echo time. That is, the second contrast image 740 may be an image obtained by combining pieces of k-space data corresponding to different echo times. The second contrast image 740 may be an image having a contrast that is lower than the first contrast.

In the first contrast image 710, a portion including fat 713 may look much darker than a portion including water 711 and a mixture 712 of water and NaCl. Also, in the second contrast image 720, a portion including fat 723 may look slightly darker than a portion including water 721 and a mixture 722 of water and NaCl.

Referring to FIG. 7, it is found that there is almost no difference between a portion including water 741, a mixture 742 of water and NaCl, and fat 743 included in the second contrast image 740 and a portion including the water 721, the mixture 722 of water and NaCl, and the fat 723 included in the second contrast image 720.

Accordingly, the second contrast image 740 obtained by combining pieces of k-space data corresponding to different echo times is hardly different from the second contrast image 720 obtained by an additional sequence having the second echo time.

Figure 8:
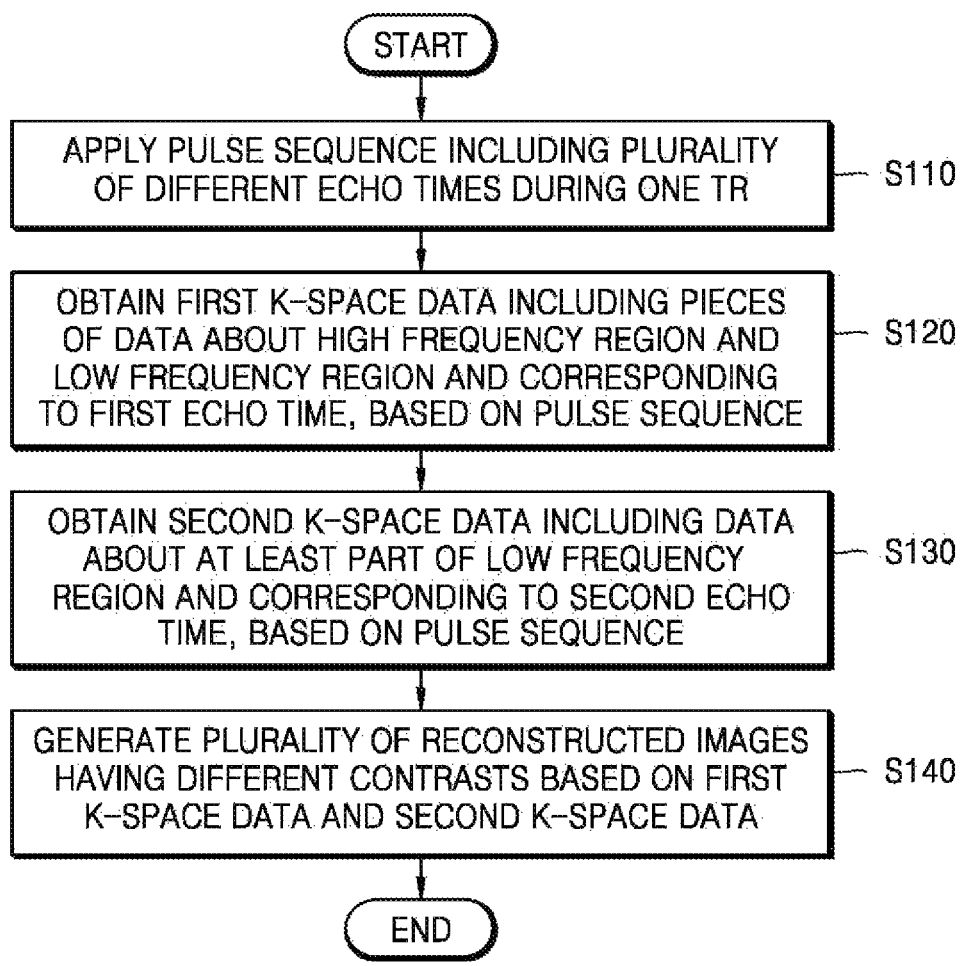
FIG. 8 is a flowchart of a method of obtaining an MR image according to an exemplary embodiment.

FIG. 8 is a flowchart illustrating of a method of obtaining an MR image according to an exemplary embodiment.

According to an exemplary embodiment, the method of obtaining the MR image may be performed by the MRI apparatus 100.

In operation S110, the MRI apparatus 100 may apply a pulse sequence including a plurality of different echo times during one TR. According to an exemplary embodiment, the pulse sequence may include all pieces of information required to control components of an MRI scanner. For example, the pulse sequence may include information about a strength, a duration, and application timing of a pulse signal applied to the MRI scanner to scan an object.

According to an exemplary embodiment, applying the pulse sequence may include controlling a waveform generator of an MRI scanner to generating a gradient wave, i.e., an electrical pulse may be generated according to a pulse sequence.

In operation S120, the MRI apparatus 100 may obtain first k-space data including pieces of data about a high frequency region and a low frequency region and corresponding to a first echo time, based on the pulse sequence.

In operation S130, the MRI apparatus 100 may obtain second k-space data including data about at least a part of the low frequency region and corresponding to a second echo time, based on the pulse sequence. The second echo time may be different from the first echo time from among the plurality of different echo times.

In operation S140, the MRI apparatus 100 may generate a plurality of reconstructed images having different contrasts based on the first k-space data and the second k-space data.

FIG. 9 is a schematic diagram of an MRI system 1 according to an exemplary embodiment. Referring to FIG. 9, the MRI system 1 may include an operating unit 10, a controller 30, and a scanner 50. The controller 30 may be independently separated from the operating unit 10 and the scanner 50 as illustrated in FIG. 9. Furthermore, the controller 30 may be separated into a plurality of sub-components and incorporated into the operating unit 10 and the scanner 50 in the MRI system 1. Operations of the components in the MRI system 1 will now be described in detail.

The scanner 50 may be formed to have a cylindrical shape (e.g., a shape of a bore) having an empty inner space into which an object may be inserted. A static magnetic field and a gradient magnetic field are created in the inner space of the scanner 50, and an RF signal is emitted toward the inner space.

The scanner 50 may include a static magnetic field generator 51, a gradient magnetic field generator 52, an RF coil unit 53, a table 55, and a display 56. The static magnetic field generator 51 creates a static magnetic field for aligning magnetic dipole moments of atomic nuclei of the object in a direction of the static magnetic field. The static magnetic field generator 51 may be formed as a permanent magnet or superconducting magnet using a cooling coil.

The gradient magnetic field generator 52 is connected to the controller 30. The gradient magnetic field generator 52 generates a gradient magnetic field by applying a gradient to a static magnetic field in response to a control signal received from the controller 30. The gradient magnetic field generator 52 includes X, Y, and Z coils for generating gradient magnetic fields in X-, Y-, and Z-axis directions crossing each other at right angles and generates a gradient signal according to a position of a region being imaged so as to differently induce resonance frequencies according to regions of the object.

The RF coil unit 53 connected to the controller 30 may emit an RF signal toward the object in response to a control signal received from the controller 30 and receive an MR signal emitted from the object. In detail, the RF coil 53 may transmit, toward atomic nuclei and having precessional motion, an RF signal having the same frequency as that of the precessional motion to the object, stop transmitting the RF signal, and then receive an MR signal emitted from the object.

The RF coil unit 53 may be formed as a transmitting RF coil for generating an electromagnetic wave having an RF corresponding to the type of an atomic nucleus, a receiving RF coil for receiving an electromagnetic wave emitted from an atomic nucleus, or one transmitting/receiving RF coil serving both functions of the transmitting RF coil and receiving RF coil. Furthermore, in addition to the RF coil unit 53, a separate coil may be attached to the object. Examples of the separate coil may include a head coil, a spine coil, a torso coil, and a knee coil according to a region being imaged or to which the separate coil is attached.

The display 56 may be disposed outside and/or inside the scanner 50. The display 56 is also controlled by the controller 30 so as to provide a user or the object with information related to medical imaging.

Furthermore, the scanner 50 may include an object monitoring information acquisition unit (not shown) configured to acquire and transmit monitoring information about a state of the object. For example, the object monitoring information acquisition unit may acquire monitoring information related to the object from a camera (not shown) for capturing images of a movement or position of the object, a respiration measurer (not shown) for measuring the respiration of the object, an ECG measurer for measuring the electrical activity of the heart of the object, or a temperature measurer for measuring a temperature of the object and transmit the acquired monitoring information to the controller 30. The controller 30 may in turn control an operation of the scanner 50 based on the monitoring information about the object. Operations of the controller 30 will now be described in more detail.

The controller 30 may control all operations of the scanner 50.

The controller 30 may control a sequence of signals formed in the scanner 50. The controller 30 may control the gradient magnetic field generator 52 and the RF coil unit 53 according to a pulse sequence received from the operating unit 10 or a designed pulse sequence.

A pulse sequence may include all pieces of information required to control the gradient magnetic field generator 52 and the RF coil unit 53. For example, the pulse sequence may include information about a strength, a duration, and application timing of a pulse signal applied to the gradient magnetic field generator 52.

The controller 30 may control a waveform generator (not shown) for generating a gradient wave, i.e., an electrical pulse according to a pulse sequence and a gradient amplifier (not shown) for amplifying the generated electrical pulse and transmitting the same to the gradient magnetic field generator 52. Thus, the controller 30 may control formation of a gradient magnetic field by the gradient magnetic field generator 52.

Furthermore, the controller 30 may control an operation of the RF coil unit 53. For example, the controller 30 may supply an RF pulse having a resonance frequency to the RF coil unit 30 that emits an RF signal toward the object, and receive an MR signal received by the RF control unit 53. In this case, the controller 30 may adjust emission of an RF signal and reception of an MR signal according to an operating mode by controlling an operation of a switch (e.g., a T/R switch) for adjusting transmitting and receiving directions of the RF signal and the MR signal based on a control signal.

The controller 30 may control a movement of the table 55 where the object is placed. Before an MRI is performed, the controller 30 may move the table 55 according to a region of the object which is to be imaged.

The controller 30 may also control the display 56. For example, the controller 30 may control the on/off state of the display 56 or a screen to be output on the display 56 according to a control signal.

The controller 30 may be formed as an algorithm for controlling operations of the components in the MRI system 1, a memory (not shown) for storing data in the form of a program, and a processor for performing the above-described operations by using the data stored in the memory. In this case, the memory and the processor may be implemented as separate chips. Alternatively, the memory and processor may be incorporated into a single chip.

The operating unit 10 may control all operations of the MRI system 1. The operating unit 10 may include an image processing unit 11, an input device 12, and an output device 13.

Also, the operating unit 10 may further include the memory 110 of FIG. 2.

The image processing unit 11 may control the memory to store an MR signal received from the controller 30, and generate image data with respect to the object from the stored MR signal by applying an image reconstruction technique by using an image processor.

For example, if a k-space (for example, also referred to as a Fourier space or a frequency space) of the memory is filled with digital data to complete k-space data, the image processing unit 11 may reconstruct image data from the k-space data by applying various image reconstruction techniques (e.g., by performing an inverse Fourier transform on the k-space data) by using the image processor.

Furthermore, the image processing unit 11 may perform various signal processing operations on MR signals in parallel. For example, the image processing unit 11 may perform signal processing on a plurality of MR signals received via a multi-channel RF coil in parallel so as to convert the plurality MR signals into image data. In addition, the image processing unit 11 may store not only the image data in the memory, or the controller 30 may store the same in an external server via a communication unit 60 as will be described below.

Also, the image processing unit 11 may include the image processor 120 of FIG. 2.

The input device 12 may receive, from the user, a control command for controlling all operations of the MRI system 1. For example, the input device 12 may receive, from the user, object information, parameter information, a scan condition, and information about a pulse sequence. The input device 12 may be a keyboard, a mouse, a track ball, a voice recognizer, a gesture recognizer, a touch screen, or any other input device.

The output device 13 may output image data generated by the image processing unit 11. The output device 13 may also output a user interface (UI) configured so that the user may input a control command related to the MRI system 1. The output device 13 may be formed as a speaker, a printer, a display, or any other output device.

Furthermore, although FIG. 9 shows that the operating unit 10 and the controller 30 are separate components, the operating unit 10 and the controller 30 may be included in a single device as described above. Furthermore, processes respectively performed by the operating unit 10 and the controller 30 may be performed by another component. For example, the image processing unit 11 may convert an MR signal received from the controller 30 into a digital signal, or the controller 30 may directly perform the conversion of the MR signal into the digital signal.

The MRI system 1 may further include a communication unit 60 and be connected to an external device (not shown) such as a server, a medical apparatus, and a portable device (e.g., a smartphone, a tablet PC, a wearable device, etc.) via the communication unit 60.

The communication unit 60 may include at least one component that enables communication with an external device. For example, the communication unit 60 may include at least one of a local area communication module (not shown), a wired communication module 61, and a wireless communication module 62.

The communication unit 60 may receive a control signal and data from an external device and transmit the received control signal to the controller 30 so that the controller 30 may control the MRI system 1 according to the received signal.

Alternatively, by transmitting a control signal to an external device via the communication unit 60, the controller 30 may control the external device according to the control signal.

For example, the external device may process data of the external device according to a control signal received from the controller 30 via the communication unit 60.

A program for controlling the MRI system 1 may be installed on the external device and may include instructions for performing some or all of the operations of the controller 30.

According to the one or more exemplary embodiments, a scan time may be reduced by obtaining images having different contrasts by using one pulse sequence.

According to the one or more exemplary embodiments, the influence of a movement of an organ may be minimized by obtaining images having a plurality of contrasts during one breath-holding duration.

The program may be preinstalled on the external device, or a user of the external device may download the program from a server providing an application for installation. The server providing an application may include a recording medium having the program recorded thereon.

Embodiments may be implemented through non-transitory computer-readable recording media having recorded thereon computer-executable instructions and data. The instructions may be stored in the form of program code, and when executed by a processor, generate a predetermined program module to perform a specific operation. Furthermore, when being executed by the processor, the instructions may perform specific operations according to the exemplary embodiments.

According to an exemplary embodiment, units, devices and/or modules described herein may be implemented using hardware components and software components. For example, the hardware components may include amplifiers, band-pass filters, audio to digital convertors, and processing devices. A processing device may be implemented using one or more hardware devices configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

According to an exemplary embodiment, software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, computer storage medium or device. The software also may be distributed over network coupled computer systems so that the software is stored and executed in a distributed fashion. The software and data may be stored by one or more non-transitory computer readable recording mediums.

According to an exemplary embodiment, the methods according to the above-described exemplary embodiments may be recorded in non-transitory computer-readable media including program instructions to implement various operations of the above-described exemplary embodiments. According to an exemplary embodiment, a non-transitory computer readable medium storing a program instructions for performing the method of FIG. 8 above may be provided. The media may also include, alone or in combination with the program instructions, data files, data structures, and the like. The program instructions recorded on the media may be those specially designed and constructed for the purposes of exemplary embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

While one or more exemplary embodiments have been described with reference to the figures, it will be understood by one of ordinary skill in the art that various changes in form and details may be made therein without departing from the spirit and scope of the present disclosure as defined by the following claims. Accordingly, the above exemplary embodiments and all aspects thereof are examples only and are not limiting.

What is claimed is:

1. A magnetic resonance imaging (MRI) apparatus comprising:
   a memory configured to store a pulse sequence; and
   a processor configured to:
      apply the pulse sequence comprising a plurality of different echo times during one repetition time (TR),
      obtain first k-space data comprising information on a high frequency region and a low frequency region and corresponding to a first echo time, among the plurality of different echo times, based on the pulse sequence,
      obtain second k-space data comprising information on at least a part of the low frequency region and corresponding to a second echo time different from the first echo time, among the plurality of different echo times, based on the pulse sequence, and
      generate a plurality of reconstructed images having different contrasts based on the first k-space data and the second k-space data.

2. The MRI apparatus of claim 1, wherein the plurality of reconstructed images having different contrasts are magnetic resonance (MR) images obtained during a same breath-holding duration.

3. The MRI apparatus of claim 1, wherein the first echo time is a longest echo time among the plurality of different echo times.

4. The MRI apparatus of claim 3, wherein the processor is further configured to generate the plurality of reconstructed images having different contrasts by using the information on the high frequency region from among the first k-space data.

5. The MRI apparatus of claim 4, wherein the processor is further configured to:
generate a first reconstructed image having a first contrast based on the first k-space data, and
generate a second reconstructed image having a second contrast that is lower than the first contrast, based on the information on the high frequency region and the information on the at least the part of the low frequency region from among the first k-space data, and the second k-space data.

6. The MRI apparatus of claim 5, wherein the first reconstructed image having the first contrast is a heavily T2-weighted image and the second reconstructed image having the second contrast is a T2-weighted image.

7. The MRI apparatus of claim 1, wherein the processor is further configured to:
repeatedly apply the pulse sequence; and
generate reconstructed images of a plurality of slices corresponding to a number of times the pulse sequence is repeatedly applied.

8. The MRI apparatus of claim 1, wherein the first k-space data and the second k-space data obtained during the one TR are pieces of k-space data of different slices.

9. The MRI apparatus of claim 1, wherein the processor is further configured to apply a signal for controlling a radio frequency (RF) coil and a gradient coil in a scanner in order to sequentially apply pulses for obtaining the first k-space data and pulses for obtaining the second k-space data.

10. The MRI apparatus of claim 1, wherein the pulse sequence comprises a single-shot fast spin echo (FSE).

11. A method of obtaining a magnetic resonance (MR) image, the method comprising:
applying a pulse sequence comprising a plurality of different echo times during one repetition time (TR);
obtaining first k-space data comprising information on a high frequency region and a low frequency region, and corresponding to a first echo time, among the plurality of different echo times, based on the pulse sequence;
obtaining second k-space data comprising information on at least a part of the low frequency region and corresponding to a second echo time different from the first echo time, among the plurality of different echo times, based on the pulse sequence; and
generating a plurality of reconstructed images having different contrasts based on the first k-space data and the second k-space data.

12. The method of claim 11, wherein the plurality of reconstructed images having different contrasts are MR images obtained during a same breath-holding duration.

13. The method of claim 11, wherein the first echo time is a longest echo time among the plurality of different echo times.

14. The method of claim 13, wherein the generating the plurality of reconstructed images having different contrasts comprises generating the plurality of reconstructed images having different contrasts by using the information on the high frequency region from among the first k-space data.

15. The method of claim 14, wherein the generating of the plurality of reconstructed images having different contrasts comprises:
generating a first reconstructed image having a first contrast based on the first k-space data; and
generating a second reconstructed image having a second contrast that is lower than the first contrast, based on the information on the high frequency region and the information on the at least the part of the low frequency region from among the first k-space data, and the second k-space data.

16. The method of claim 15, wherein the first reconstructed image having the first contrast is a heavily T2-weighted image and the second reconstructed image having the second contrast is a T2-weighted image.

17. The method of claim 11, wherein the obtaining of the plurality of reconstructed images having different contrasts comprises:
repeatedly applying the pulse sequence; and
generating reconstructed images of a plurality of slices corresponding to a number of times the pulse sequence is repeatedly applied.

18. The method of claim 11, wherein the first k-space data and the second k-space data obtained during the one TR are pieces of k-space data of different slices.

19. The method of claim 11, wherein the applying of the pulse sequence comprises applying a signal for controlling a radio frequency (RF) coil and a gradient coil in a scanner in order to sequentially apply pulses for obtaining the first k-space data and pulses for obtaining the second k-space data.

20. A non-transitory computer-readable storage medium having embodied thereon a program for executing the method of claim 11.

* * * * *